(12) United States Patent
Cornelissen et al.

(10) Patent No.: US 7,755,742 B2
(45) Date of Patent: Jul. 13, 2010

(54) LITHOGRAPHIC APPARATUS WITH MOUNTED SENSOR

(75) Inventors: Sebastiaan Maria Johannes Cornelissen, Eindhoven (NL); Martinus Agnes Willem Cuijpers, Veldhoven (NL); Cornelis Christiaan Ottens, Veldhoven (NL); Peter Smits, Baarlo (NL); Johannes Antonius Maria Van De Wal, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 99 days.

(21) Appl. No.: 11/246,554

(22) Filed: Oct. 11, 2005

(65) Prior Publication Data

US 2007/0081141 A1 Apr. 12, 2007

(51) Int. Cl.
*G03B 27/58* (2006.01)
(52) U.S. Cl. .......................................................... 355/72
(58) Field of Classification Search .................... 355/72, 355/30, 75, 53
See application file for complete search history.

(56) References Cited

U.S. PATENT DOCUMENTS

| 6,084,215 | A  | * | 7/2000 | Furuya et al. | 219/444.1 |
|---|---|---|---|---|---|
| 2002/0063221 | A1 | * | 5/2002 | Li | 250/491.1 |
| 2003/0001107 | A1 |  | 1/2003 | Kroon et al. | 350/492.2 |
| 2004/0108467 | A1 | * | 6/2004 | Eurlings et al. | 250/492.1 |
| 2005/0140962 | A1 |  | 6/2005 | Ottens et al. | 355/75 |
| 2006/0103820 | A1 |  | 5/2006 | Donders et al. | 355/53 |

FOREIGN PATENT DOCUMENTS

| EP | 1 486 828 A2 | 12/2004 |
|---|---|---|
| EP | 1 503 246 A2 | 2/2005 |
| EP | 1 517 185 A1 | 3/2005 |
| KR | 2005-11713 A | 1/2005 |
| WO | WO 02/29495 * | 4/2002 |
| WO | WO 02/29495 A1 | 4/2002 |
| WO | WO 02/29495 * | 11/2002 |

OTHER PUBLICATIONS

European Search Report issued for European Patent Application No. 06255017.3-1226, dated Feb. 8, 2007.

* cited by examiner

*Primary Examiner*—Edward J Glick
*Assistant Examiner*—Chia-how Michael Liu
(74) *Attorney, Agent, or Firm*—Pillsbury Winthrop Shaw Pittman LLP

(57) ABSTRACT

A lithographic apparatus is disclosed in which a circular sensor is mounted to a substrate table with three leaf springs that are evenly spaced around a thermal axis of the sensor. The leaf springs are provided in two parts that are releasably attachable to each other. The leaf springs are elastic and allow some movement of the sensor relative to the substrate table on thermal expansion and contraction but ensure that the thermal center of the sensor does not move relative to the substrate table.

7 Claims, 4 Drawing Sheets

LITHOGRAPHIC APPARATUS WITH MOUNTED SENSOR

FIELD

The present invention relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Sensors are used on the substrate table on which the substrate is mounted for aligning the substrate with a patterned beam of radiation. Sensors include transmission image sensors (TIS), spot sensors and integrated lens interferometer at scanner (ILIAS) sensors. In the prior art, these sensors have been glued to the substrate table.

SUMMARY

It is desirable to alleviate problems associated with thermal expansion and contraction of an object mounted on a substrate table.

According to an aspect of the invention, there is provided a lithographic apparatus comprising: a substrate table constructed to hold a substrate; and an object mounted on said substrate table via at least one mount, wherein said mount is attached between said object and said substrate table and is elastic thereby to allow some relative movement of said object to said substrate table.

According to an aspect of the invention, there is provided a lithographic apparatus comprising: a substrate table constructed to hold a substrate; and an object mounted on said substrate table with a mount, said mount comprising a first mount part attached to said object and a second mount part attached to said substrate table, said first and second mount parts being releasably attachable and being deformable for linear movement along on first axis and rotational deformation through two axes orthogonal to one another and orthogonal to said first axis.

According to an aspect of the invention, there is provided a lithographic apparatus comprising: a substrate table constructed to hold a substrate; and an object mounted on said substrate table, wherein said object is mounted via three leaf springs arranged equally spaced around a thermal center of said object such that inward and outward radial movement of said leaf springs is possible thereby to ensure that on thermal expansion or contraction of said object said center of said object remains stationary relative to said substrate table.

According to an aspect of the invention, there is provided a lithographic apparatus comprising: a substrate table constructed to hold a substrate; and a sensor mounted in a recess on said substrate table; wherein, in plan, said sensor is circular and is spaced apart from said substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
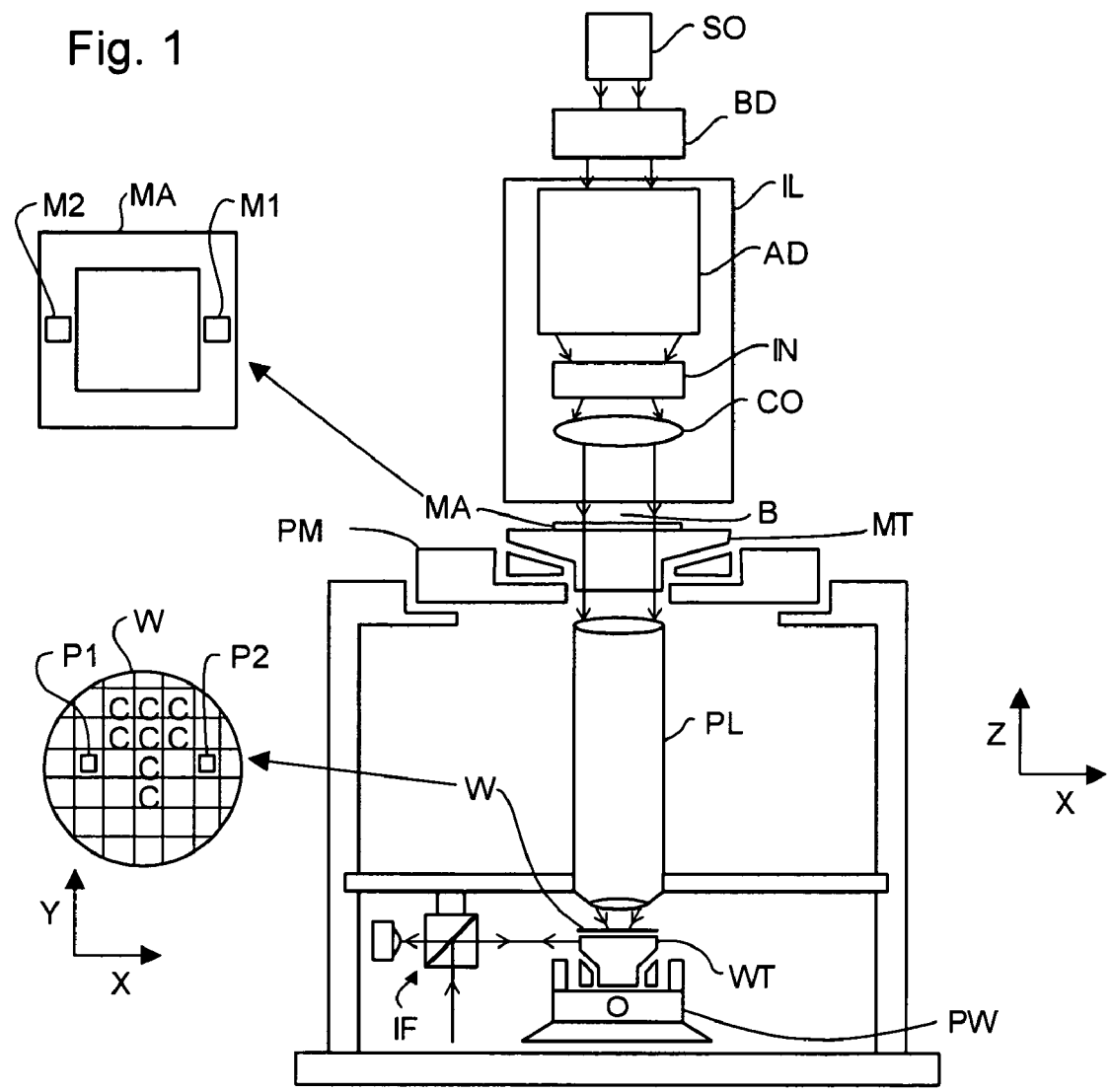
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure supports MT, i.e. bears the weight of, the patterning device MA. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
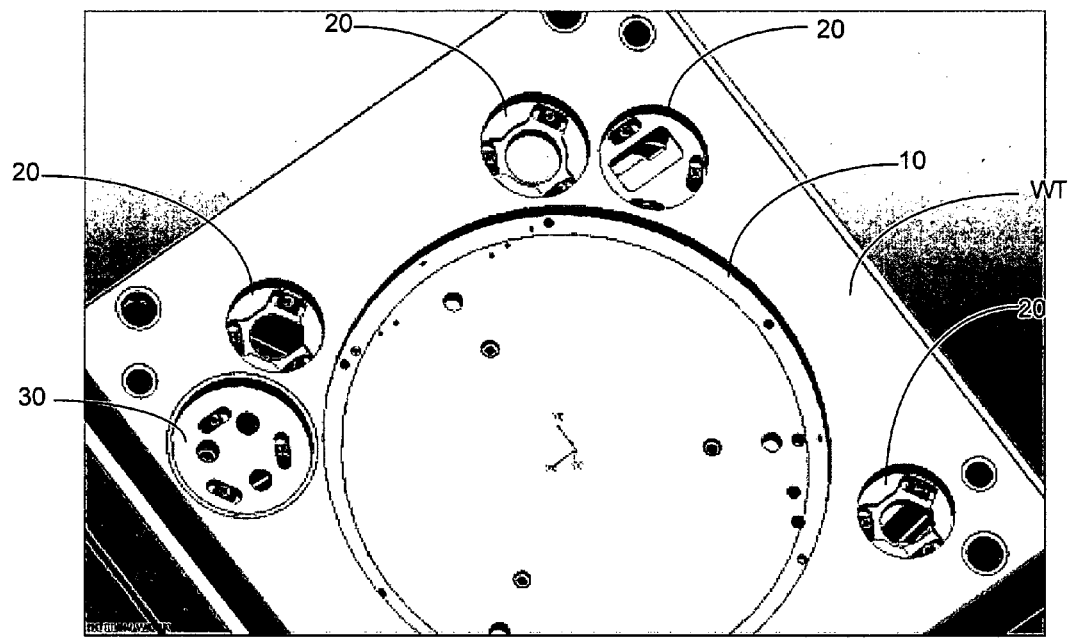
FIG. 2 depicts a substrate table showing recesses for various sensors and a closing disk support all of which recesses have three second mount parts of a mount glued in place.

FIG. 2 shows a substrate table WT from above for use in a immersion lithographic apparatus in which immersion liquid is positioned between the projection system PL and the substrate W during imaging. The substrate table WT in FIG. 2 is shown without any components attached.

A pimple table or chuck will be positioned in the recess 10. The pimple table or chuck will hold the substrate W in place during imaging.

Conventionally, during thermal expansion and contraction of the sensors, which can particularly occur in an immersion lithography machine in which immersion liquid is placed between the projection system and the object being imaged, drift of the position of the sensor on the substrate table can occur. This can introduce inaccuracies in the positioning of the substrate and is the result of friction and hysteresis in the glued interfaces between the sensor and the substrate table. This is a particular problem in immersion lithography systems but is also a problem in non-immersion system.

Sensors such as transmission image sensors (TIS), spot sensors or ILIAS sensors will be positioned in recesses 20. The recesses 20 for sensors are, in plan, circular or round and this is different to convention in which sensors are shaped so as to minimize the forces they encounter in immersion lithography and to minimize the space they take up on the substrate table WT.

A further recess 30 is provided for a closing disk support. A closing disk support supports a closing disk while it is not being used. A closing disk is used during substrate swap in the following way. After the substrate W has been imaged, the substrate table WT is positioned under the projection system PL such that the closing disk is under the projection system PL. The closing disk is then attached to the liquid supply system which provides immersion liquid between the projection system PL and the substrate W during imaging so that the liquid supply system does not need to be deactivated and the final element of the projection system remains wet during substrate swap thereby preventing drying stains. Once the closing disk has been attached to the liquid supply system, the substrate table WT can be moved away. After a fresh substrate is provided on a substrate table WT, the substrate table WT is positioned such that the closing disk can be unloaded onto the closing disk support and then the substrate table WT is moved so that imaging of the substrate W can begin.

In immersion lithography temperature control of sensors during imaging (sensors are imaged wet, i.e., under the same conditions as the substrate with immersion liquid between them and the projection system) can be difficult. Conventionally, sensors are glued in place on a substrate table and large thermal expansion or contraction can lead to drift of the position of the sensor relative to the substrate table WT because of friction and hysteresis in the solid interfaces from the sensor to the substrate table WT.

In the design of this embodiment the sensors are circular in plan and are mounted in the recesses 20 such that a gap exists between the outer circumference of the sensor and the inner circumference of the recess 20. Thus, the sensor can expand and contract uninhibited by the presence of the substrate table WT. The provision of a sensor which is round allows arrangements to be made, which are described below, to ensure that the center of the sensor, which is where the sensing elements are positioned, stays substantially stationary relative to the substrate table WT. This is because a circular sensor (which might be in the shape of a cylinder) will expand and contract equally around a thermal center axis. This is not the case with prior art sensors, which are odd shapes and whose expansion and contraction is not uniform.

The provision of circular sensors also means that sealing the gap between the substrate table WT and the sensor so that immersion liquid does not leak into that gap is simplified. For example, a simple annular sticker can be placed to bridge the gap between the top surface of the sensor and the top surface of the substrate table WT thereby sealing the gap between the sensor and substrate table. The symmetrical displacement is more easy to deal with in this situation.

Furthermore, the use of a round sensor allows the use of sensor mounts to be positioned between the substrate table WT and the sensor itself. These mounts are arranged symmetrically around the thermal center axis which passes through the thermal center of the sensor (which in the case of a round sensor would be its center) and which is perpendicular to the top surface of the sensor and the substrate table WT. The mounts are positioned symmetrically around this thermal axis and spaced equally from it. The mounts may be in the form of leaf springs (of equal elastic constant) which are fixedly attached to the substrate table WT and the bottom of the sensor (for example by gluing) and thermal expansion or thermal contraction of the sensor results in the thermal center of the sensor remaining stationary relative to the substrate table WT as each of the leaf spring mounts expand and contract elastically by the same amount as the size of the sensor varies with temperature fluctuations.

The leaf spring mounts described above will now be described in more detail with reference to FIGS. 3-7. Although the invention will be described relative to the use of three mounts, clearly it is possible to use more than three mounts. The mounts are positioned symmetrically around the thermal axis of the sensor to ensure equal resistance to thermal expansion around the circumference of the sensor. The closing disk support can be mounted in the same way with the same advantages. Neither the bottom surface of the sensor nor the bottom surface of the recess need to be perfectly flat because the flexibility of the mounts make sure that there is no deformation of the sensor due to any unevenness.

Figure 3:
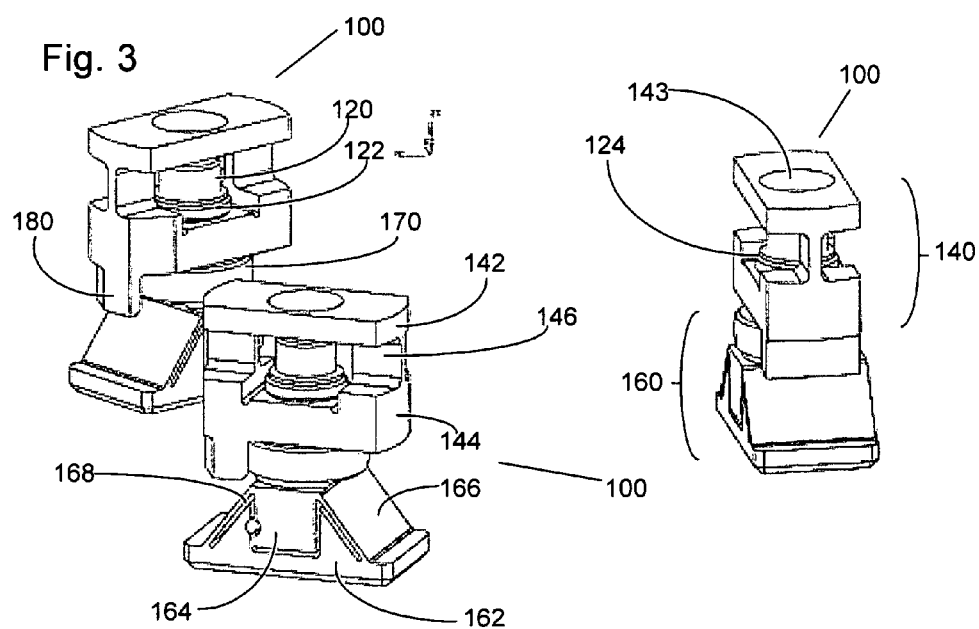
FIG. 3 illustrates three mounts as they would be in use without the substrate table, sensor or closing disk support being present.

FIG. 3 illustrates three mounts 100. The mounts are formed of a first mount part 140 and a second mount part 160. The first mount part 140 is glued to the sensor and the second mount part 160 is glued to the substrate table WT. The first and second mount parts are releasably attachable together through a screw fixing 120. The screw fixing 120 is screwed through a through hole 143 in the first mount part 140 into a receiving hole 126 (shown in FIG. 5) in the second mount part 160. Underneath the bolt head is a spring disk 122 and a washer 124 to prevent the torque applied to the screw fixing 120, in the form of a bolt, from displacing the positioned sensor.

The first mount part 140 and the second mount part 160 are made from a material with a low coefficient of expansion, preferably with a coefficient of thermal expansion of less than $5 \times 10^{-6}$ °C.$^{-1}$ between 20 and 30° C. The material is also elastic and one material which suits these criteria is INVAR®, which is a metal with a low coefficient of thermal expansion and a Youngs Modulus ("E") of approximately $1.4 \times 10^{11}$ $Nm^2$. The complex shapes of the mounts 100 can be easily machined from this material.

As illustrated, the mounts 100 are placed at 120° intervals around the thermal center of the sensor. Each of the mounts has a portion which acts as a leaf spring to allow movement of the top of the mount relative to the bottom of the mount in a direction radially outwardly from the thermal center. In the illustrated embodiment, this is provided in the first mount part 140 by a mechanical weakness which is formed as a thinner portion 146 between an upper portion 142 and a lower portion 144 (see FIG. 3). The upper portion 142 is positioned furthest from the second mount part 160 and is the part that is glued to the sensor. The lower portion 144 is the part closest to the second mount part 160 and is positioned distal from the sensor. The thinner portion 146 allows linear movement of the upper part 142 relative to the lower part 144 in a direction radially outwardly (or inwardly) of the thermal center. The thinner portion 146 can also allow rotation of the upper portion 142 relative to the lower portion 144 about a first axis which is perpendicular to the thermal axis and the direction radially outwardly of the thermal center, and parallel to the top surface of the sensor. This will be described in more detail in relation to FIG. 4.

The thinner portion 146 is elongate in the direction of the first axis thereby substantially to prevent rotation of the upper part 142 relative to the lower part 144 around an axis parallel to the thermal axis. A cut out is provided in the center of the thinner portion 146 to allow for the positioning of the head of the screw fixing 120.

The second mount part 160 is also comprised of an upper part 164 and a lower part 162. A machined gap 168 in the shape of an inverted top hat with the ends angled downwards towards the top of the hat that the upper portion 164 is effectively attached to the lower portion 162 by a pair of elongate members 166. The elongate members 166 are attached on opposite sides of a portion of the upper portion 164 positioned away from the lower portion 162 such that on flexing of the elongate members 166 the upper portion 164 is rotatable relative to the lower portion 162. The first mount part 140 and the second part 160 are rotatable relative to each other such that the axis through which the upper portion 142 and the lower portion 144 of the first mount part 140 rotate is perpendicular to the axis about which the upper and lower portions 162, 164 of the second mount part 160 rotate relative to each other. This will be described in more detail in relation to FIG. 4.

The elongate members 166 have a thickness in the direction of the second axis to prevent relative rotation of the upper and lower portions 162, 164 in an axis parallel to the longitudinal axis of the screw fixing 120.

Each first mount portion 140 has a downwardly projecting interface member 180. The interface member 180 has on its inner surface an interface surface which interacts with a projection 170 of the second mount part 160. The interface surface and the projection abut at a point contact and allow orientation of the sensor relative to the substrate table WT accurately prior to fixing of the first mount part 140 and the second mount part 160 with screw fixing 120. This will be described in more detail relative to FIG. 7.

Figure 4:
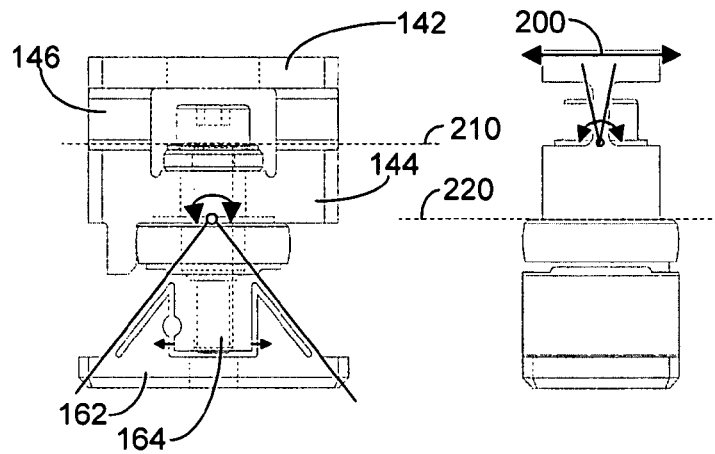
FIG. 4 illustrates a mount front and side view.

Turning now to FIG. 4, the types of rotation and linear movement between the various portions of an assembled mount will be described. With this configuration, only three types of movement should be possible. The first of these is linear movement 200 of the top portion 142 of the first mount part relative to the bottom portion 144. This movement is in direction 200 which is radially inward and outward from the thermal axis. This movement is allowed for by deflection of the thinner portion 146 and accounts for thermal expansion and contraction of the sensor relative to the substrate table WT. This movement is mechanically equivalent to a leaf spring and is elastic.

The second kind of movement which is allowed is also provided for by the thin portion 146 and is rotation around a first axis 210 which is perpendicular to the thermal axis. A third type of movement is rotation around a second axis 220 which is perpendicular to the first axis and which substantially passes through the thermal axis.

Rotation through the second axis 220 is of the upper portion 164 of the second part 160 relative to the bottom portion 162 of the second part 160.

The mount 100 has been described to have various movements and rotations possible between specific parts of the mount. Clearly other types of arrangement are possible to allow the different types of movement and it is possible to design a mount which allows all of the above movements but which provides for these movements in different ways. For example, it is possible that the linear movement could be provided in the second mount part rather than the first mount part.

Figure 5:
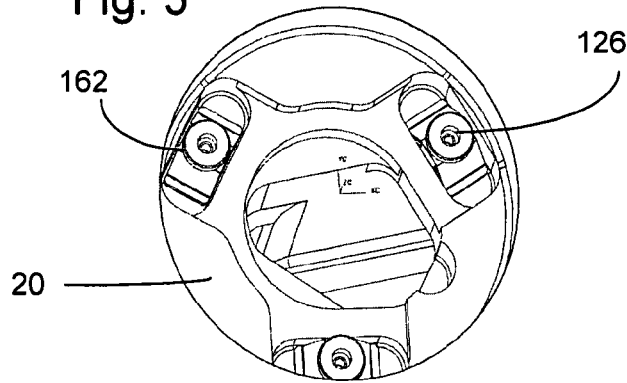
FIG. 5 illustrates the second mount part of the mounts in a recess in the substrate table.
Figure 6:
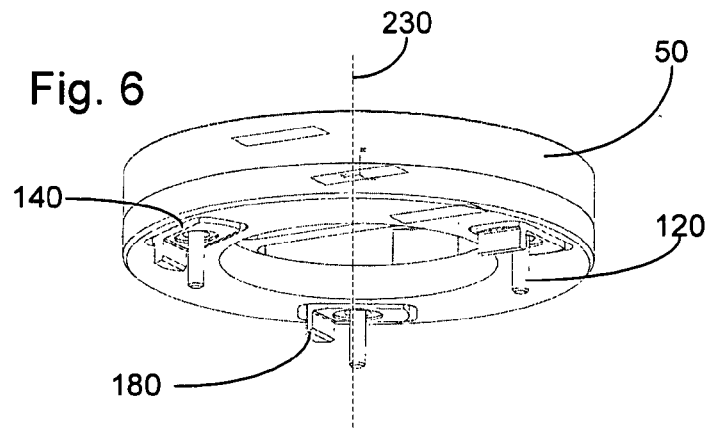
FIG. 6 illustrates the second mount part of the mounts glued to a sensor.

FIGS. 5 and 6 show how a sensor 50 can be mounted in a recess 20 of the substrate table WT. The recess 20 has three second mount parts glued to its bottom surface. The second mount parts are orientated such that the second axis of each of those mount parts passes through what will be the thermal axis of the sensor and such that the mounts are equally spaced around the thermal axis, in this case because there are three mounts they are spaced at 120° intervals.

The sensor 50 is illustrated in FIG. 6 and has had the first mount parts 140 already glued in place. These mount parts have been orientated such that their first axis is perpendicular to the thermal axis 230 of the sensor 50.

Figure 7:
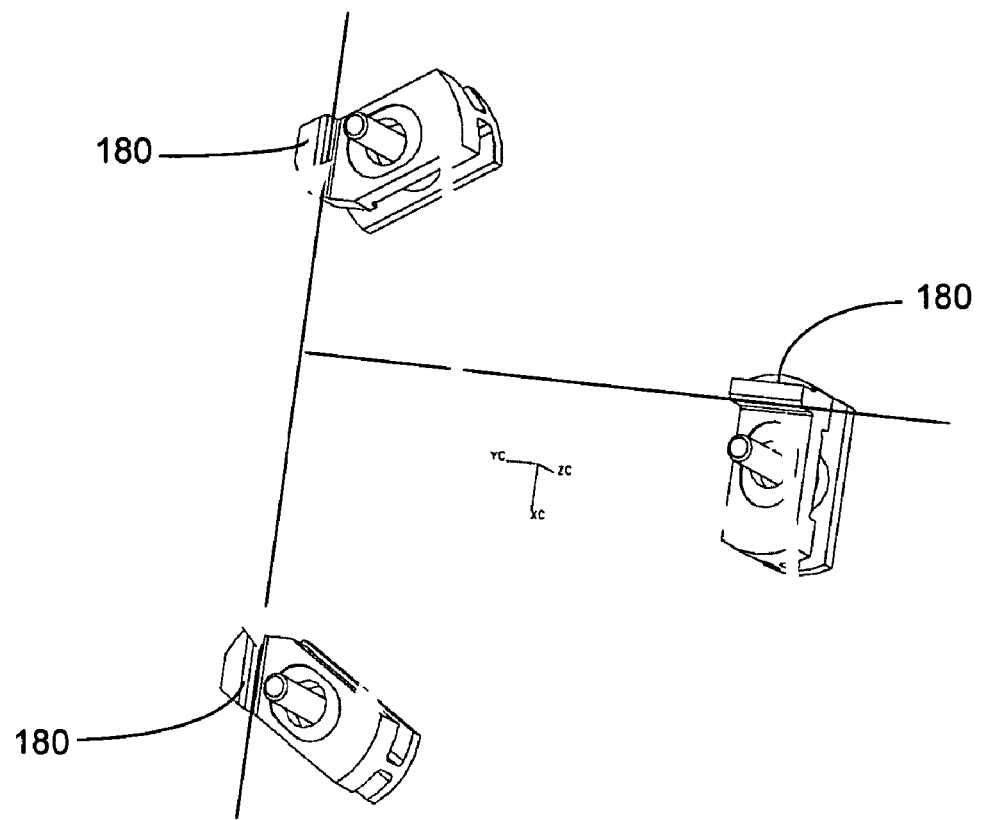
FIG. 7 illustrates the first mount part of three mounts from underneath.

Each of the mounts has a slightly different interface member 180 and the reason for this will be described below in relation to FIG. 7. The screw fixing 120 is already provided in the mount and is accessible through a hole in the top surface of the sensor 50. The screw fixing 20 will be received in the receiving hole 126 as the sensor is positioned in the recess 20.

In order to ensure correct alignment of the sensor 50 relative to the substrate table WT the interface members 180 are provided. FIG. 7 shows that two interfaces 180 are provided such that their interface surfaces lie in the same plane when the sensor 50 is correctly aligned to the substrate table WT. The other interface member 180 is provided such that its interface surface is in a plane perpendicular to the plane in which the other two interface surfaces lie. This ensures that the two interface surfaces which lie in the same plane, when they are in point of contact with the respective protrusion 170 on the second mount part 160 align the sensor correctly in the Rz and y degrees of freedom. The interface surface which lies in its own plane is used for positioning in the x degree of freedom and all three interfaces co-operate to ensure correct alignment in the z, Rx and Ry directions. Thus, when the sensor is mounted onto the substrate table WT the sensor is pushed until the interface surfaces of the first mount parts 140 are positioned against the projections 170 of the second mount parts. The bolts have enough space to limit x, y and Rz movement of the sensor. When positioned correctly, the bolts are tightened with a predescribed torque.

Thus, the interface surfaces and the projections 170 have no function once the screw fixings 120 have been tightened.

The invention provides a way of mounting an object such as a closing disk support or a sensor which ensures that on thermal expansion or contraction of the object the center of the object (in the case of a sensor where the detecting parts of the sensor are positioned) remains substantially stationary relative to the substrate table WT. Furthermore, the provision of the mount in two parts allows for easily assembly, positioning and disassembly of the sensor to the substrate table WT.

Although the mounts are shown as being positioned evenly around the thermal center, this is not necessarily the case and they need not be positioned at 120° intervals nor need they be positioned an equal distance from the thermal center.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a substrate table constructed to hold a substrate during exposure of the substrate to a beam of radiation; and
an object mounted on said substrate table via at least one mount,
wherein said mount is attached between said object and said substrate table and comprises an elastic material to allow some relative movement of said object to said substrate table,
wherein said mount is formed from a first mount part and a second mount part, one of said first and second mount parts being attached to said object and the other of said first and second mount parts being attached to said substrate table,
wherein said first and second mount parts are releasably attached to each other.

2. The lithographic apparatus of claim 1, wherein said first mount part is formed with a flexible portion to allow bending rotation about a first axis between an upper member of said first mount part and a lower member of said first mount part, and wherein said upper member is attached to said object and said lower member is attached to said second mount part.

3. The lithographic apparatus of claim 1, wherein said second mount part is formed with a flexible portion to allow bending rotation about a second axis between an upper member of said second mount part and a lower member of said second mount part, and wherein said upper member is attached to said first mount part and said lower member is attached to said substrate table.

4. The lithographic apparatus of claim 1, wherein said first mount part is constructed and arranged to allow linear movement in the plane of the top surface of said object between an upper member of said first mount part and a lower member of said first mount part, and wherein said upper member is attached to said object and said lower member is attached to said second mount part in a direction parallel to a plane that passes through the center of said object and the center of said mount.

5. The lithographic apparatus of claim 1, wherein said first mount part has an interface surface that is substantially perpendicular to the top surface of said object and said interface surface is arranged for point contact with a surface on said second mount part.

6. A lithographic apparatus comprising:
a substrate table constructed to hold a substrate during exposure of the substrate to a beam of radiation, said substrate table comprising a recess; and
a sensor mounted in the recess;
wherein, in plan, said sensor and said recess are circular and an outer circumferential surface of the sensor is surrounded by and spaced apart from an inner circumferential surface of the recess in a radial direction relative to a center of the sensor,
wherein said sensor is mounted via three leaf springs arranged equally spaced around a thermal center axis of said sensor such that inward and outward radial movement of said leaf springs is possible thereby to ensure that on thermal expansion or contraction of said sensor, said center of said sensor remains stationary relative to said substrate table.

7. The lithographic apparatus of claim 6, wherein the three leaf springs are mounted within the substrate table.

* * * * *